US012514082B2

(12) United States Patent
Kim et al.

(10) Patent No.: US 12,514,082 B2
(45) Date of Patent: Dec. 30, 2025

(54) DRIVING DEVICE AND A DISPLAY DEVICE

(71) Applicant: LX SEMICON CO., LTD., Daejeon (KR)

(72) Inventors: Seong Geon Kim, Daejeon (KR); Yong Su Kwon, Daejeon (KR); Seong Yeon Park, Daejeon (KR); Taiming Piao, Daejeon (KR); Byeon Cheol Lee, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/584,361

(22) Filed: Feb. 22, 2024

(65) Prior Publication Data

US 2024/0284734 A1 Aug. 22, 2024

(30) Foreign Application Priority Data

Feb. 22, 2023 (KR) ........................ 10-2023-0023610
Feb. 1, 2024 (KR) ........................ 10-2024-0016223

(51) Int. Cl.
*H10K 59/131* (2023.01)
*G09G 3/3225* (2016.01)

(52) U.S. Cl.
CPC ......... *H10K 59/131* (2023.02); *G09G 3/3225* (2013.01); *G09G 2300/0842* (2013.01)

(58) Field of Classification Search
CPC .. H01K 59/131; G09G 3/3225; G09G 3/3233; G09G 2300/0842; G09G 2300/0408; G09G 2300/0426; G09G 2320/0223; G09G 2320/0295; G09G 2330/028
See application file for complete search history.

(56) References Cited

U.S. PATENT DOCUMENTS

2009/0184627 A1* 7/2009 Kim .................... G09G 3/3208 445/24
2014/0312330 A1* 10/2014 Chaji .................... G09G 3/006 438/18
2023/0032028 A1* 2/2023 Hong .................. G09G 3/3291

OTHER PUBLICATIONS

European Search Report dated Jun. 13, 2024 issued for the European Patent Application No. 24158753.4, 11 pages.

* cited by examiner

*Primary Examiner* — Brent D Castiaux
(74) *Attorney, Agent, or Firm* — ROTHWELL, FIGG, ERNST & MANBECK, P.C.

(57) ABSTRACT

The driving device can include a plurality of pad regions, a plurality of switching regions, and a plurality of driving regions. The plurality of pad regions can include a plurality of terminals and be disposed along a plurality of side portions of the substrate. The plurality of switching regions can include a plurality of switches and be located farther from the plurality of side portions than the plurality of pad regions. The plurality of driving regions can be disposed adjacent to the central region of the substrate. The plurality of switching regions can be located between the plurality of pad regions and the plurality of driving regions.

20 Claims, 6 Drawing Sheets

DRIVING DEVICE AND A DISPLAY DEVICE

CROSS-REFERENCE TO RELATED APPLICATIONS

The present application claims the benefits of priority to Korean Patent Application No. 10-2023-0023610, filed on Feb. 22, 2023 and Korean Patent Application No. 10-2024-0016223, filed on Feb. 1, 2024, the entire contents of which are hereby expressly incorporated by reference into the present application

BACKGROUND OF THE DISCLOSURE

Embodiments of this disclosure are related to a driving device and a display device. A display panel implementing an organic light emitting display or a liquid crystal display are gradually becoming larger. Accordingly, the number of driving devices for driving a larger display panel increases. To this end, design efforts are being focused to achieve higher speeds and lower power consumption.

FIG. 1 shows a general display device. For convenience, one pixel of the display panel 100 is shown in FIG. 1, but a plurality of pixels can be provided in the display panel 100.

As shown in FIG. 1, the pixel includes a scan switch 110, a driving transistor 120, an organic light emitting device 130, and a storage capacitor Cs. The pixel includes a sensing switch 140, a sensing capacitor Cp, etc. The driving device 200 includes a plurality of terminals 250 and 260-1, a sensing circuit 220, and a switch 210-1. The driving device 200 drives the display panel 100. That is, the driving device 200 provides data voltage VDATA to the display panel 100, and the display panel 100 displays an image using the data voltage VDATA. The switch 210-1 and the terminal 260-1 are connected by a conductive line 270-1.

When the scan switch 110 of the pixel is turned on according to a scan signal, the data voltage VDATA output from the driving device 200 is supplied to a gate electrode of the driving transistor 120 through a terminal 261. The terminal 261 is provided on the display panel 100. As the sensing switch 140 is turned on according to a first control signal SENSE and the switch 210-1 is turned on according to a second control signal REF, a reference voltage VREF input through the first terminal 250 is supplied to a source electrode of the driving transistor 120 through the switch 210-1, the second terminal 260-1, and the sensing switch 140. In this instance, the storage capacitor Cs is charged with the difference between the data voltage VDATA and the reference voltage VREF, and a driving current corresponding to the charged voltage, that is, the gate-source voltage, flows through the driving transistor 120. Accordingly, light having luminance corresponding to the driving current can be emitted from the organic light emitting device 130.

Meanwhile, when the switch 210-1 is turned off, a voltage on the node N between the source electrode of the driving transistor 120 and the organic light emitting device 130 is applied to the sensing capacitor Cp as a sensing signal, and is supplied to the sensing circuit 220 through the second terminal 260-1 of the driving device 200. The sensing circuit 220 converts the sensing signal into digital sensing data. The digital sensing data includes information about the characteristic of the pixel.

The driving device 200 receives a sensing signal from each of the plurality of pixels provided on the display panel 100, and compensates for the data voltage VDATA to be supplied to each pixel of the display panel 100 based on each of these sensing signals.

In the drawing, the switch 210-1 and the sensing circuit 220 share the second terminal 260-1, but, in some embodiments, they can be connected to independent terminals.

FIG. 2 shows a driving device.

Referring to FIGS. 1 and 2, the driving device 200 includes a switching region 210, a first driving region 221, a second driving region 222, a plurality of terminals 260-1 to 260-*k*, and other circuit region 290.

The other circuit region 290 is provided with a sensing circuit 220, a control circuit, etc. Each of the first driving region 221 and the second driving region 222 includes a plurality of driving circuits. Each driving circuit generates a data voltage VDATA to be supplied to each pixel on the display panel 100.

The switching region 210 is located between the first driving region 221 and the second driving region 222. The switching region 210 is provided with a plurality of switches 210-1 to 210-*k*. Each of the plurality of switches 210-1 to 210-*k* is connected to each pixel on the display panel 100 to switch the selective supply of the reference voltage VREF.

Meanwhile, a plurality of conductive lines 270-1 to 270-*k* are connected between a plurality of switches 210-1 to 210-*k* provided in the switching region 210 and a plurality of terminals 260-1 to 260-*k* provided in the edge area of the substrate 201.

As shown in FIG. 2, since the length of each conductive line 270-1 to 270-*k* is different depending on the position of the conductive line 270-1 to 270-*k*, the transfer time of the reference voltage VREF from each switch 210-1 to 210-*k* to each terminal 260-1 to 260-*k* is different. Accordingly, since the time for the reference voltage VREF to be transmitted to each pixel on the display panel 100 is different for each conductive line 270-1 to 270-*k*, a deterioration problem occurs.

In order to solve this problem, the length of each of the conductive lines 270-1 to 270-(k−1) increases to be equal to the length of the longest conductive line 270-*k* among the plurality of conductive lines 270-1 to 270-*k*. To this end, each of the conductive lines 270-1 to 270-(k−1) is disposed in a zigzag or serpentine shape in the first driving region 221 or the second driving region 222. Accordingly, due to the plurality of driving circuits as well as the conductive lines 270-1 to 270-*k* having a zigzag or serpentine shape in the first driving region 221 or the second driving region 222, complexity increases and electrical short-circuit problem occurs. In order to solve this electrical short-circuit problem, the size of the driving device 200 must be increased. There is a problem that the increase in the size of the driving device 200 runs counter to the decrease in parts.

In addition, by disposing each conductive line 270-1 to 270-*k* in a zigzag or serpentine shape, the length of each conductive line 270-1 to 270-*k* is increased, and the reference voltage VREF is delayed, making it difficult to implement high-speed driving.

Meanwhile, as shown in FIG. 3, a resistance component $R_{REF}$ and a capacitance component $C_{REF}$ can be generated in the conductive line 270-1. The resistance component $R_{REF}$ is inherent in the conductive line 270-1, and the capacitance component $C_{REF}$ is formed by various layers between the substrate 201. As the length of the conductive line 270-1 increases, the resistance component $R_{REF}$ and/or the capacitance component $C_{REF}$ increase. The delay of the reference voltage VREF on the conductive line 270-1 can be expressed as a time constant that is the product of the resistance component $R_{REF}$ and the capacitance component $C_{REF}$ on the conductive line 270-1. Accordingly, when the conductive line 270-1 increases, both the resistance component $R_{REF}$ and the capacitance component $C_{REF}$ increase, so that it can be seen that the time constant increases rapidly.

Therefore, in order to reduce delay of delivering the reference voltage VREF to the pixels, it is required a layout in which a plurality of conductive lines having the same length is disposed so as to minimize the length of each of the plurality of conductive.

SUMMARY OF THE DISCLOSURE

An object of the embodiment is to solve the foregoing and other problems.

Another purpose of the embodiments is to provide a driving device and a display device that implement an optimal layout.

Another purpose of the embodiments is to provide a driving device and a display device that can minimize the length of each conductive line.

The technical problems of the embodiments are not limited to those described in this item and include those that can be understood through the description of this disclosure.

In order to achieve the above or other objects, according to one aspect of the embodiment, a driving device, comprising: a plurality of pad regions comprising a plurality of terminals and disposed along a plurality of side portions of a substrate; a plurality of switching regions comprising a plurality of switches and disposed farther from the plurality of side portions than the plurality of pad regions; and a plurality of driving regions disposed adjacent to a central region of the substrate, wherein the plurality of switching regions are located between the plurality of pad regions and the plurality of driving regions.

The plurality of side portions can comprise a first side portion and a second side portion configured to face each other in a first direction; and a third side portion and a fourth side portion configured to face each other in a second direction.

The driving device can comprise a plurality of conductive regions comprising a plurality of conductive lines connected between the plurality of terminals and the plurality of switches and disposed between the plurality of pad regions and the plurality of switching regions. The plurality of pad regions can comprise a first group of pad regions disposed adjacent to the first side portion, the plurality of switching regions can comprise a first group of switching regions disposed farther from the first side portion than the first group of pad regions, and the plurality of conductive regions can comprise a first group of conductive regions disposed between the first group of pad regions and the first group of switching regions.

The plurality of pad regions can comprise a second group of pad regions disposed adjacent to the second side portion, the plurality of switching regions can comprise a second group of switching regions disposed farther from the second side portion than the second group of pad regions, and the plurality of conductive regions can comprise a second group of conductive regions disposed between the second group of pad regions and the second group of switching regions.

The first group of switching regions can comprise a first switching region, and a second switching region spaced apart from the first switching region.

The second group of switching regions can comprise a third switching region, and a fourth switching region spaced apart from the third switching region.

A length of the third switching region can be greater than a length of the first region, and the number of switches included in the third switching region can be greater than the number of switches included in the first switching region.

A length of the fourth switching region can be greater than a length of the second switching region, and the number of switches included in the fourth switching region can be greater than the number of switches included in the second switching region.

The plurality of pad regions can comprise a fifth pad region disposed adjacent to the third side portion, the plurality of switching regions can comprise a fifth switching region disposed farther from the third side portion than the fifth pad region, and the plurality of conductive regions can comprise a fifth conductive region disposed between the fifth pad region and the fifth switching region.

The plurality of pad regions can comprise a sixth pad region disposed adjacent to the fourth side portion, the plurality of switching regions can comprise a sixth switching region disposed farther from the fourth side portion than the sixth pad region, and the plurality of conductive regions can comprise a sixth conductive region disposed between the sixth pad region and the sixth switching region.

Each of the plurality of conductive lines can have a straight line along one direction between the corresponding terminal and the corresponding switch.

The plurality of conductive lines can have the same length with each other.

Distances between the plurality of terminals and the plurality of switches can be the same, respectively.

A reference voltage can be transmitted to the plurality of switches through at least one input terminal and to a display panel through the plurality of terminals.

According to another aspect of the embodiment to achieve the above or other objects, the driving device, comprising: a first pad region and a second pad region, wherein the first pad region and the second pad region are spaced apart from each other along a first side portion of a substrate; a third pad region and a fourth pad region, wherein the third pad region and the fourth pad region are spaced apart from each other along a second side portion of the substrate; a first driving region and a second driving region, wherein the first driving region and the second driving region are disposed on a first side portion of a central area of the substrate and correspond to the first pad region and the second pad region, respectively; a third driving region and a fourth driving region, wherein the third driving region and the fourth driving region are disposed on a second side portion of the central area of the substrate and correspond to the third pad region and the fourth pad region, respectively; a first switching region between the first pad region and the first driving region; a second switching region between the second pad region and the second driving region; a third switching region between the third pad region and the third driving region; and a fourth switching region between the fourth pad region and the fourth driving region.

The driving device can comprise a first conductive region between the first pad region and the first switching region; a second conductive region between the second pad region and the second switching region; a third conductive region between the third pad region and the third switching region; and a fourth conductive region between the fourth pad region and the fourth switching region.

Each of the first pad region, the second pad region, the third pad region, and the fourth pad region can comprise a plurality of terminals, each of the first switching region, the second switching region, the third switching region, and the fourth switching region can comprise a plurality of switches, and each of the first conductive region, the second conductive region, the third conductive region, and the fourth conductive region can comprise a plurality of conductive lines.

Distances between the plurality of terminals and the plurality of switches can be the same, respectively.

According to another aspect of the embodiment to achieve the above or other objects, a display device, comprising: a display panel comprising a plurality of subpixels; and a driving device configured to drive the display panel, wherein the driving device comprises: a plurality of pad regions comprising a plurality of terminals connected to the plurality of subpixels and disposed along a plurality of side portions of a substrate; a plurality of switching regions comprising a plurality of switches and disposed farther from the plurality of side portions than the plurality of pad regions; and a plurality of driving regions disposed adjacent to a central region of the substrate, and wherein the plurality of switching regions are located between the plurality of pad regions and the plurality of driving regions.

A reference voltage can be transmitted to the plurality of switches through at least one input terminal and to the display panel through the plurality of terminals.

The effects of the driving device and display device according to the embodiments are described as follows.

According to at least one of the embodiments, the length of each of the plurality of conductive lines in the plurality of conductive regions is minimized and is the same, so that the settling time of the reference voltage supplied to each subpixel is the same, and no degradation problem occurs.

According to at least one of the embodiments, the resistance component and the capacitance component of each conductive line are minimized, so that high-speed driving can be implemented.

According to at least one of the embodiments, since each of the plurality of conductive lines has a straight line along one direction, complexity is reduced and an electrical short-circuit problem does not occur as well as that an increase in the size of the driving device can be prevented.

According to at least one of the embodiments, the length of the entire conductive line between the input terminal through which the reference voltage is inputted and the output terminal through which the reference voltage is outputted can be minimized, and the layout of the conductive line can be simplified. In addition, the total area occupied by the routing of conductive lines in the driving device is dramatically reduced, thereby improving chip productivity and economic efficiency due to savings in chip production costs.

Figure 1:
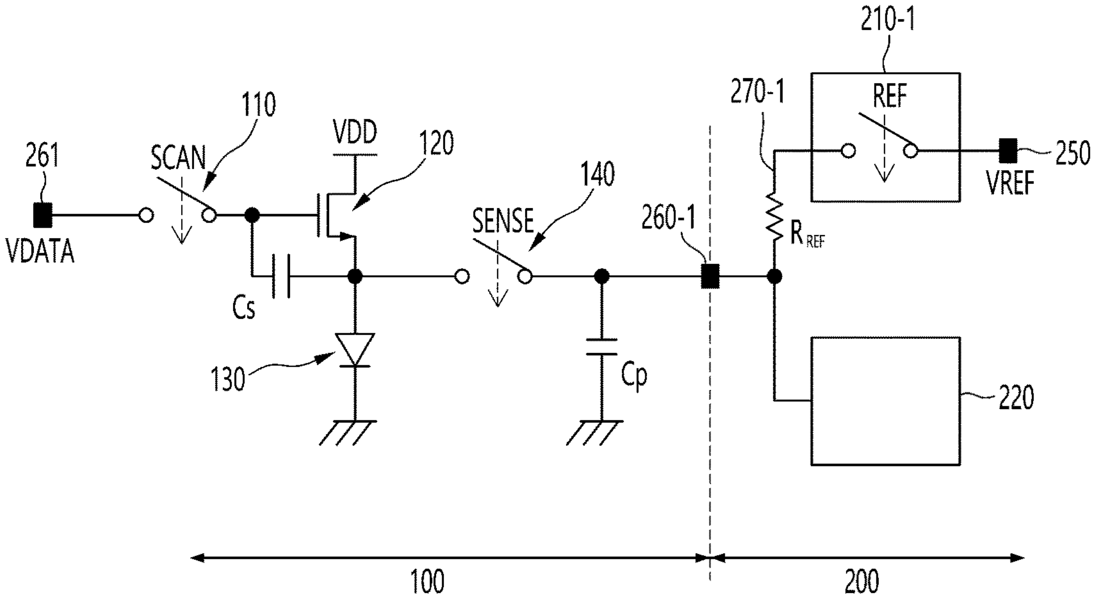
FIG. 1 shows a general display device.
Figure 2:
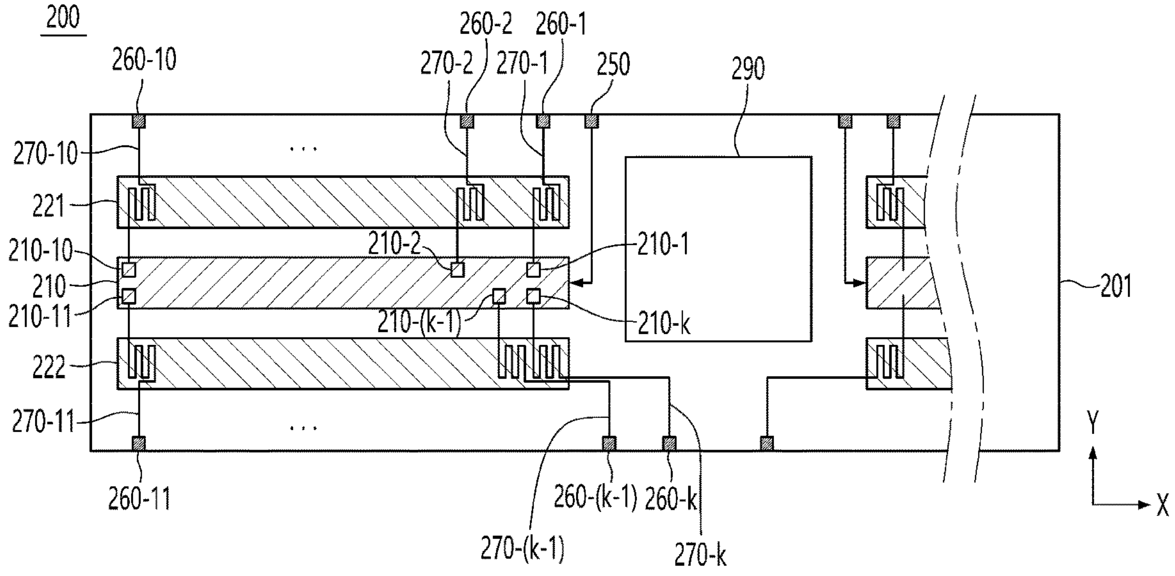
FIG. 2 shows a driving device.

Additional scope of applicability of the embodiments will become apparent from the detailed description that follows. However, since various changes and modifications within the spirit and scope of the embodiments may be clearly understood by those skilled in the art, the detailed description and specific embodiments, such as preferred embodiments, should be understood as being given by way of example only.

DETAILED DESCRIPTION OF EMBODIMENTS

Hereinafter, the embodiments disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiments disclosed in this specification, and the technical idea disclosed in this specification is not limited by the accompanying drawings. Also, when an element such as a layer, region or substrate is referred to as being 'on' another element, this means that there can be directly on the other element or be other intermediate elements therebetween.

The reference numerals of the components of the display panel described below will refer to FIG. 1.

The driving device can be referred to as a driving chip, a driving integrated circuit, a driving IC, etc. Here, it should be noted that the term "chip" does not mean only individually packaged chip configurations, but can also mean that several chips are combined in a hybrid form, or that they are packaged in contact with each other at the chip level. It is clarified that the meaning of such terms should be interpreted based on the description of the technical content of this disclosure.

Since the driving device drives the display panel, it can also be called a display driving device.

Meanwhile, in the following description, the terminal can refer to a form in which a pin and a pad are combined, but is not limited thereto. Typically, the pin can refer to a conductive member that protrudes outside the package to electrically connect a semiconductor chip to other external components. The pad can refer to a flat conductive member disposed on a substrate for bonding with the pin on the semiconductor chip. After the semiconductor chip is mounted on the substrate, the pin on the semiconductor chip and the pad on the substrate is electrically connected, and the connected point can be referred to as a terminal.

Figure 4:
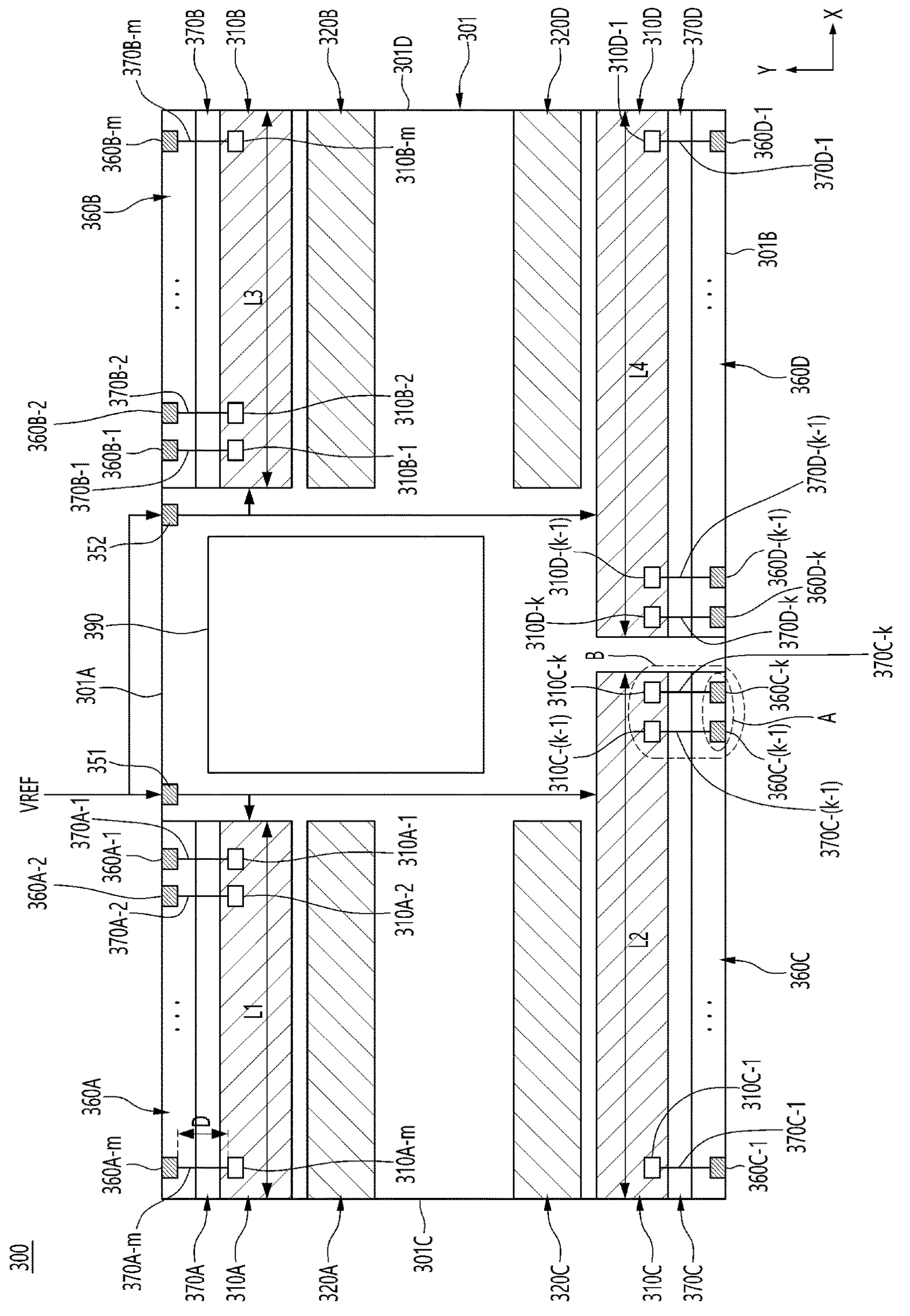
FIG. 4 shows a driving device according to some embodiments.

FIG. 4 shows a driving device according to some embodiments.

Referring to FIG. 4, the driving device 300 according to some embodiments can comprise a plurality of pad regions 360A to 360D, a plurality of switching regions 310A to 310D, a plurality of conductive regions 370A to 370D, etc.

The substrate 301 can comprise a central area and an edge area surrounding the central area. Here, the edge area can be an area within a predetermined distance from a plurality of side portions 301A to 301D of the substrate 301. The area within a predetermined distance can be, for example, a region comprising the plurality of pad regions 360A to 360D, the plurality of conductive regions 370A to 370D, and the plurality of switching regions 310A to 310D. The area within the predetermined distance can be, for example, a region that does not include a plurality of driving regions 320A to 320D, but is not limited thereto.

The plurality of pad regions 360A to 360D, the plurality of switching regions 310A to 310D, and/or the plurality of conductive regions 370A to 370D can be disposed in an edge area of the substrate 301. For example, in the edge area of the substrate 301, the plurality of pad regions 360A to 360D, the plurality of conductive regions 370A to 370D, and the plurality of switching regions 310A to 310D can be disposed in order from the plurality of side portions 301A to 301D toward the central area of the substrate 301.

The plurality of pad regions 360A to 360D can comprise a plurality of terminals 360A-1 to 360A-m, etc. That is, a region comprising the plurality of terminals 360A-1 to 360A-m, etc. can be defined as the plurality of pad regions 360A to 360D. The plurality of pad regions 360A to 360D can be disposed along the plurality of side portions 301A to 301D of the substrate 301. Each of the plurality of terminals 360A-1 to 360A-m, etc. can be connected to each pixel (or subpixel) on the display panel 100 and can be an output terminal through which a reference voltage VREF is output.

The plurality of switching regions 310A to 310D can comprise a plurality of switches 310A-1 to 310A-m, etc. That is a region comprising the plurality of switches 310A-1 to 310A-m, etc. can be defined as the plurality of switching regions 310A to 310D. The plurality of switching regions 310A to 310D can be disposed farther from the plurality of side portions 301A to 301D of the substrate 301 than the plurality of pad regions 360A to 360D. The plurality of switches 310A-1 to 310A-m, etc. can be connected to a plurality of terminals 360A-1 to 360A-m, etc. of the plurality of pad regions 360A to 360D, respectively. Each of the plurality of switches 310A-1 to 310A-m, etc. can control supplying and/or blocking of the reference voltage VREF.

Each switch 310A-1 to 310A-m, etc. can be composed of an NMOS transistor, a PMOS transistor, or a complementary transistor combining them.

At least input terminals 351 and 352 can be provided along the first side portion 301A of the substrate 301. The at least input terminals 351 and 352 can be connected to the plurality of switching regions 310A to 310D. Specifically, the at least input terminals 351 and 352 can be connected to the plurality of switches 310A-1 to 310A-m, etc. in the plurality of switching regions 310A to 310D. The reference voltage VREF can be input through the at least input terminals 351 and 352. The reference voltage VREF can be supplied to the plurality of switches 310A-1 to 310A-m, etc. in the plurality of switching regions 310A to 310D through the at least one input terminal 351 and 352.

The plurality of conductive regions 370A to 370D can comprise a plurality of conductive lines 370A-1 to 370A-m, etc. That is, a region comprising the plurality of conductive lines 370A-1 to 370A-m, etc. can be defined as the plurality of conductive regions 370A to 370D. The plurality of conductive regions 370A to 370D can be disposed between the plurality of pad regions 360A to 360D and the plurality of switching regions 310A to 310D. The plurality of conductive lines 370A-1 to 370A-m, etc. can be connected to the plurality of terminals 360A-1 to 360A-m, etc. in the plurality of pad regions 360A to 360D and the plurality of switches 310A-1 to 310A-m, etc. in the plurality of switching regions 310A to 310D, respectively.

When each switch 310A-1 to 310A-m, etc. in the plurality of switching regions 310A to 310D is turned on, the reference voltage VREF supplied to each switch 310A-1 to 310A-m, etc. can be supplied to each pixel of the display panel 100 through each conductive line 370A-1 to 370A-m, etc. of the plurality of conductive regions 370A to 370D and each terminal 360A-1 to 360A-m, etc. of the plurality of pad regions 360A to 360D.

The substrate 301 can have a first side portion 301A, a second side portion 301B, a third side portion 301C, and a fourth side portion 301D. When the substrate 301 has a quadrangular shape, side portions of the quadrangular shape will be defined as a first side portion 301A, a second side portion 301B, a third side portion 301C, and a fourth side portion 301D, respectively. In this instance, both ends of the first side portion 301A, the second side portion 301B, the third side portion 301C, and the fourth side portion 301D can meet or contact each other.

The first side portion 301A and the second side portion 301B can be positioned to face each other, and the third side portion 301C and the fourth side portion 301D can be positioned to face each other. The first side portion 301A and the second side portion 301B can be located in the Y-axis direction, and the third side portion 301C and the fourth side portion 301D can be located in the X-axis direction.

The first side portion 301A, the second side portion 301B, the third side portion 301C, and the fourth side portion 301D can have different lengths. For example, the substrate 301 can have a rectangular shape. The length of the first side portion 301A or the second side portion 301B can be greater than the length of the third side portion 301C or the fourth side portion 301D, but is not limited thereto. In this instance, the X-axis direction can be defined as the major axis direction, and the Y-axis direction can be defined as the minor axis direction.

Meanwhile, the plurality of pad regions 360A to 360D can comprise a first group of pad regions 360A and 360B disposed adjacent to the first side portion 301A of the substrate 301. The plurality of pad regions 360A to 360D can comprise a second group of pad regions 360C and 360D disposed adjacent to the second side portion 301B of the substrate 301.

The plurality of switching regions 310A to 310D can comprise a first group of switching regions 310A and 310B disposed farther from the first side portion 301A of the substrate 301 than the first group of pad regions 360A and 360B. The plurality of switching regions 310A to 310D can comprise a second group of switching regions 310C and 310D disposed farther from the second side portion 301B of the substrate 301 than the second group of pad regions 360C and 360D.

The plurality of conductive regions 370A to 370D can comprise a first group of conductive regions 370A and 370B disposed between the first group of pad regions 360A and 360B and the first group of switching regions 310A and 310B. The plurality of conductive regions 370A to 370D can comprise a second group of conductive regions 370C and 370D disposed between the second group of pad regions 360C and 360D and the second group of switching regions 310C and 310D.

The first group of switching regions 310A and 310B can be separated into at least two. For example, the first group of switching regions 310A and 310B can comprise a first switching region 310A and a second switching region 310B spaced apart from the first switching region 310A. The size of the first switching region 310A and the size of the second switching region 310B can be the same, but is not limited thereto. The number of switches 310A-1 to 310A-m, etc. included in the first switching region 310A and the number of switches 310A-1 to 310A-m, etc. included in the second switching region 310B can be the same, but is not limited thereto.

The second group of switching regions 310C and 310D can be separated into at least two. For example, the second group of switching regions 310C and 310D can comprise a third switching region 310C and a fourth switching region 310D spaced apart from the third switching region 310C. The size of the third switching region 310C and the size of the fourth switching region 310D can be the same, but is not limited thereto. The number of switches 310A-1 to 310A-m, etc. included in the third switching region 310C and the number of switches 310A-1 to 310A-m, etc. included in the fourth switching region 310D can be the same, but is not limited thereto.

The first switching region 310A and the third switching region 310C can be disposed to face each other. The first switching region 310A and the third switching region 310C can be located in the minor axis direction (Y-axis direction). The second switching region 310B and the fourth switching region 310D can be disposed to face each other. The second switching region 310B and the fourth switching region 310D can be located in the minor axis direction (Y-axis direction).

The first switching region 310A and the third switching region 310C can have different sizes. The second switching region 310B and the fourth switching region 310D can have different sizes. The first switching region 310A, the second switching region 310B, the third switching region 310C and the fourth switching region 310D can have different lengths L1, L2, L3 and L4. Here, the lengths L1, L2, L3 and L4 can be defined along the major axis direction (X-axis direction).

As an example, the first switching region 310A and the third switching region 310C can have different lengths L1 and L2. For example, the length L2 of the third switching region 310C can be greater than the length L1 of the first switching region 310A. The number of switches 310C-1 to 310C-k included in the third switching region 310C can be greater than the number of switches 310A-1 to 310A-m included in the first switching region 310A.

As another example, the second switching region 310B and the fourth switching region 310D can have different lengths L3 and L4. For example, the length L4 of the fourth switching region 310D can be greater than the length L3 of the second switching region 310B. The number of switches 310D-1 to 310D-k included in the fourth switching region 310D can be greater than the number of switches 310B-1 to 310B-m included in the second switching region 310B.

The first group of pad regions 360A and 360B and/or the second group of pad regions 360C and 360D can each be separated into at least one or more—e.g., first pad region 360A, second pad region 360B, third pad region 360C, and fourth pad region 360D. The first group of conductive regions 370A and 370B and/or the second group of conductive regions 370C and 370D can each be separated into at least one or more—e.g., the first conductive region 370A, the second conductive region 370B, the third conductive region 370C, and the fourth conductive region 370D.

Even though FIG. 4 shows that the third pad region 360C and the fourth pad region 360D, the third conductive region 370C and the fourth conductive region 370D, and the third switching region 310C and the fourth switching region 310D are as being separated from each other, but, in some embodiments, they can be integrally formed (or connected) without being separated from each other.

The driving device 300 according to some embodiments can comprise a plurality of driving regions 320A to 320D. The plurality of driving regions 320A to 320D can be disposed in the central area or adjacent to the central area of the substrate 301. The plurality of driving regions 320A to 320D can comprise a plurality of driving circuits. Each driving circuit can generate a data voltage VDATA to be supplied to each pixel on the display panel 100.

The plurality of driving regions 320A to 320D can be disposed farther from the plurality of side portions 301A to 301D of the substrate 301 than the plurality of switching regions 310A to 310D. In other words, the plurality of pad regions 360A to 360D, the plurality of conductive regions 370A to 370D, the plurality of switching regions 310A to 310D, and the plurality of driving regions 320A to 320D can be disposed in order from the plurality of side portions 301A to 301D of the substrate 301 toward the central area of the substrate 301. In this instance, the plurality of conductive regions 370A to 370D can be disposed between the plurality of pad regions 360A to 360D and the plurality of switching regions 310A to 310D, and the plurality of switching regions 310A to 310D can be disposed between the plurality of conductive regions 370A to 370D and the plurality of driving regions 320A to 320D.

A plurality of driving circuits included in the plurality of driving regions 320A to 320D can be connected to a plurality of data output terminals disposed on the plurality of side portions 301A to 301D of the substrate 301.

Figure 5:
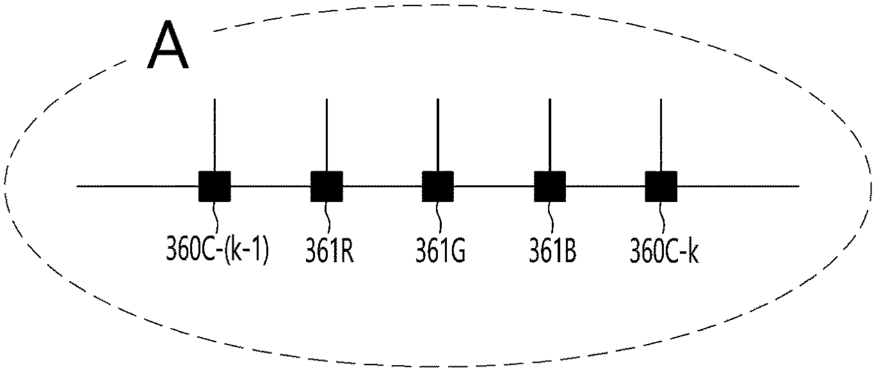
FIG. 5 is an enlarged view of area A of FIG. 4.

As shown in FIG. 5, the data output terminals 361R, 361G, and 361B can be included in the plurality of pad regions 360A to 360D, but is not limited thereto. The plurality of data output terminals 361R, 361G, and 361B can be located between adjacent terminals 360C-(k−1) and 360C-k.

The plurality of data output terminals 361R, 361G, and 361B can comprise a first data output terminal 361R for outputting a red data voltage, a second data output terminal 361G for outputting a green data voltage, and a third data output terminal 361B for outputting a blue data voltage.

For example, the red data voltage generated in a first driving circuit can be supplied to a first subpixel of the pixel on the display panel 100 through the first data output terminal 361R. A red organic light emitting device of the first subpixel can emit red light by using the red data voltage. For example, the green data voltage generated in a second driving circuit can be supplied to a second subpixel of the pixel through the second data output terminal 361G. A green organic light emitting device of the second subpixel can emit green light by using the green data voltage. For example, the blue data voltage generated in a third driving circuit can be supplied to a third subpixel of the pixel through the third data output terminal 361B. A blue organic light emitting device of the third subpixel can emit blue light by using the blue data voltage.

For example, the first driving circuit, the second driving circuit, and the third driving circuit can be included in the second driving region 320C, but is not limited thereto.

Meanwhile, the plurality of driving regions 320A to 320D can comprise a first group of driving regions 320A and 320B disposed farther from the first side portion 301A of the substrate 301 than the first group of switching regions 310A and 310B. The driving region 320A to 320D can comprise a second group of driving regions 320C and 320D disposed farther from the second side portion 301B of the substrate 301 than the second group of switching regions 310C and 310D. The first group of driving regions 320A and 320B and/or the second group of driving regions 320C and 320D can each be separated into at least one or more.

Although not shown, a region containing at least one or more components can be defined between the first group of driving regions 320A and 320B and the second group of driving regions 320C and 320D. For example, another switching region comprising a plurality of output switches can be disposed between the first group of driving regions 320A and 320B and the second group of driving regions 320C and 320D, but is not limited thereto. Each output switch can be connected between each driving circuit included in the plurality of driving regions 320A to 320D and each data output terminal 361R, 361G, and 361B, and can control whether to output the data voltage generated by each driving circuit through each data output terminals 361R, 361G, and 361B.

Although not shown, a plurality of output switches can be included in the plurality of pad regions 360A to 360D. Each of the output switches can be composed of an NMOS transistor, a PMOS transistor, or a complementary transistor combining them.

Figure 6:
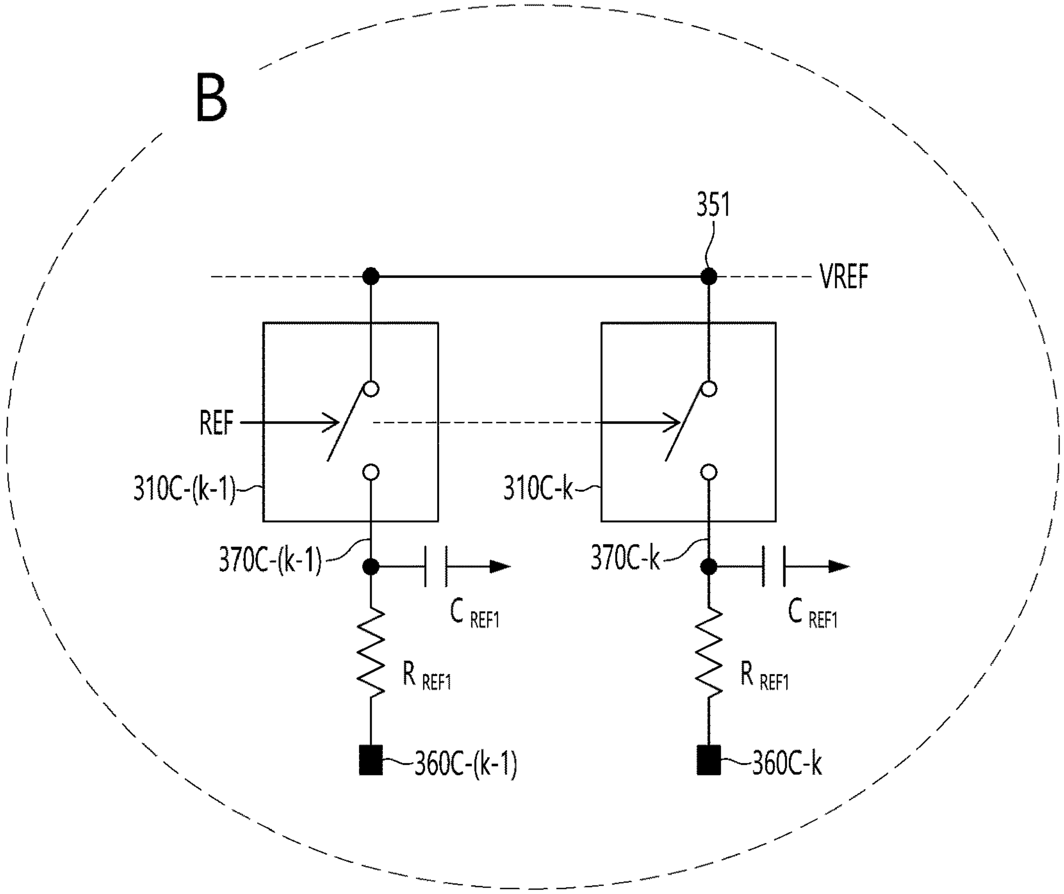
FIG. 6 is an enlarged view of area B in FIG. 4.

Meanwhile, as shown in FIG. 6, the input terminal 351 can be commonly connected to one side of the $(k-1)^{th}$ switch 310C-(k−1) and one side of the $k^{th}$ switch 310C-k. The other side of the $(k-1)^{th}$ switch 310C-(k−1) can be connected to the $(k-1)^{th}$ terminal 360C-(k−1) through the $(k-1)^{th}$ conductive line 370C-(k−1). The other side of the $k^{th}$ switch 310C-k can be connected to the $k^{th}$ terminal 360C-k through the $k^{th}$ conductive line 370C-k. Each of the $(k-1)^{th}$ switch 310C-(k−1) and the $k^{th}$ switch 310C-k can be turned on/off by the control signal REF. The $(k-1)^{th}$ switch 310C-(k−1) and the $k^{th}$ switch 310C-k can be turned on/off simultaneously or independently by the control signal REF.

As described above, the switching region 310C can be disposed adjacent to the pad region 360C, and the $(k-1)^{th}$ conductive line 370C-(k−1) and the $k^{th}$ conductive line 370C-k included in the conductive region 370C can have a straight line along one direction (Y-axis direction). That is, since the $(k-1)^{th}$ conductive line 370C-(k−1) and the $k^{th}$ conductive line 370C-k do not have a zigzag or serpentine shape, each of the $(k-1)^{th}$ conductive line 370C-(k−1) and the $k^{th}$ conductive line 370C-k can have the same and minimized length. Accordingly, as shown in FIG. 6, the $(k-1)^{th}$ conductive line 370C-(k−1) and the $k^{th}$ conductive line 370C-k have the same resistance component $R_{REF}1$ and/or can have the same capacitance component $C_{REF}1$.

In this instance, the time for which the reference voltage VREF is supplied from the $(k-1)^{th}$ switch 310C-(k−1) to a first subpixel on the display panel 100, that is, settling time and the time for which the reference voltage VREF is supplied from the $k^{th}$ switch 310C-k to a second subpixel can be the same. Accordingly, the settling time of the reference voltage VREF supplied to each subpixel (or pixel) is the same and minimized, thereby preventing deterioration and enabling high-speed driving.

Meanwhile, the unexplained reference numeral 390 can represent other circuit region. Other circuit region 390 can comprise a sensing circuit, a control circuit, etc.

Figure 7:
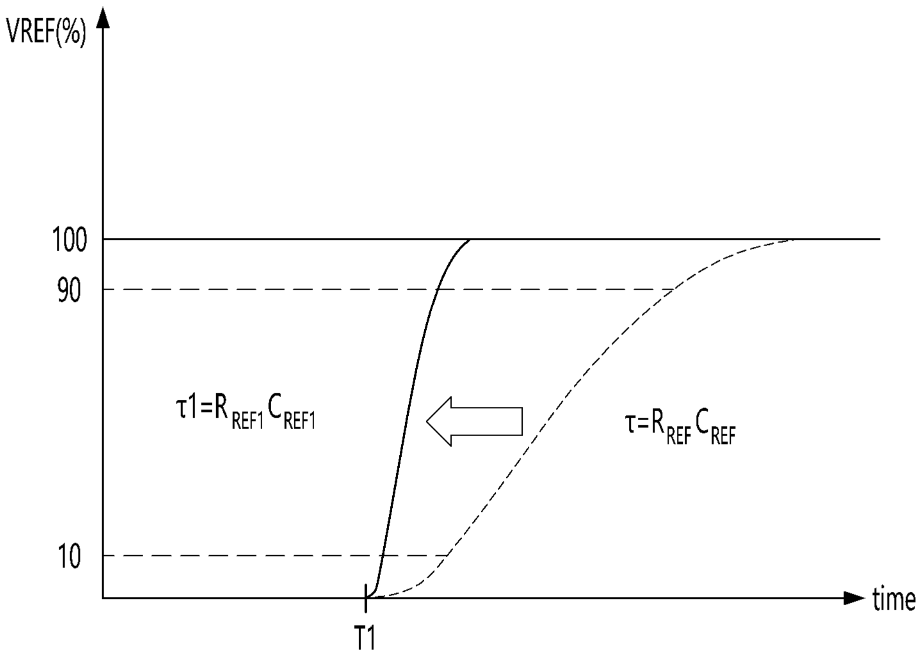
FIG. 7 shows time constants according to the comparative example.

FIG. 7 shows a difference in time constants according to the comparative example and some embodiments of this disclosure. The comparative example is the time constant at the conductive line 270-1 shown in FIG. 3, and the embodiments correspond to the time constant at the conductive line 370C-k shown in FIG. 6.

Figure 3:
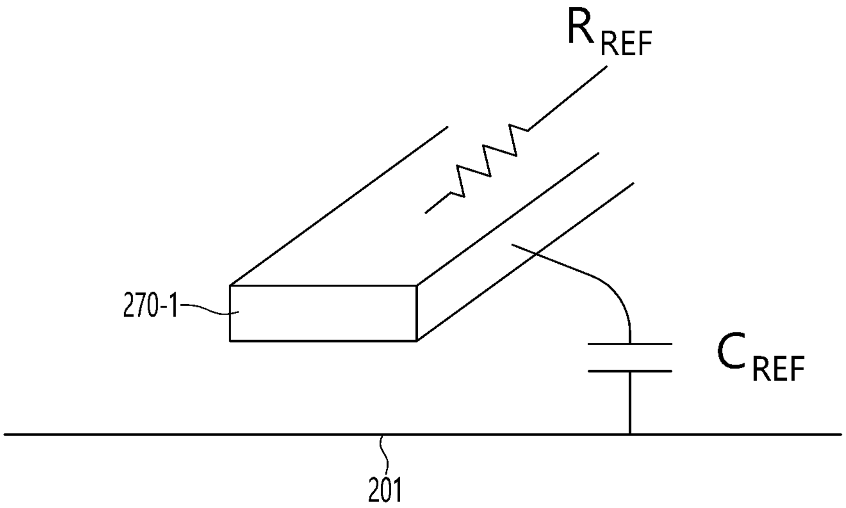
FIG. 3 shows the resistance component and the capacitance component of the conductive line.

As shown in FIG. 3, since the conductive line 270-1 has a zigzag or serpentine shape, the resistance component $R_{REF}$ or the capacitance component $C_{REF}$ of the conductive line 270-1 is large, so that the time constant ($\tau=R_{REF}\cdot C_{REF}$) is also very large. Accordingly, it can be confirmed that the reference voltage VREF is significantly delayed.

In contrast, as shown in FIG. 6, since the conductive line 370C-k can have a straight line in one direction (Y-axis direction) and its length can be minimized, the resistance component $R_{REF}1$ or the capacitance component $C_{REF}1$ of the conductive line 370C-k can be very small, so that the time constant ($\tau 1=R_{REF}1\cdot C_{REF}1$) can be also very small. Accordingly, it can be confirmed that almost no delay in the reference voltage VREF occurs.

Meanwhile, as shown in FIG. 7, the settling time can be defined as the time it takes from the switching of the switch to begin at time T1 until the reference voltage VREF charged to the corresponding pixel on the display panel 100 reaches the 90% level from the 10% level, but is not limited to this. It can be seen that the settling time in the embodiments is significantly shorter than the comparative example.

According to the embodiments, the plurality of switching regions 310A to 310D can be disposed adjacent to the plurality of pad regions 360A to 360D. That is, since the plurality of driving regions 320A to 320D are not disposed between the plurality of pad regions 360A to 360D and the plurality of switching regions 310A to 310D, the plurality of switching regions 310A to 310D can be disposed closer to the plurality of pad regions 360A to 360D. Thus, the distance between the plurality of pad regions 360A to 360D and the plurality of switching regions 310A to 310D can be minimized.

The distance D between the plurality of terminals 360A-1 to 360A-m, etc. of the plurality of pad regions 360A to 360D and the plurality of switches 310A-1 to 310A-m, etc. of the plurality of switching regions 310A to 310D can be the same. Since a plurality of switches 310A-1 to 310A-m, etc. are disposed closer to a plurality of terminals 360A-1 to 360A-m, etc., the length of each of the plurality of conductive lines 370A-1 to 370A-m, etc. of the plurality of conductive regions 370A to 370D disposed between the plurality of pad regions 360A to 360D and the plurality of switching regions 310A to 310D can be minimized. Each of the plurality of conductive lines 370A-1 to 370A-m, etc. can have the same length. Accordingly, the plurality of conductive lines 370A-1 to 370A-m, etc. can have the same resistance component $R_{REF}1$ and/or the same capacitance component $C_{REF}1$.

Since each of the plurality of conductive lines 370A-1 to 370A-m, etc. has the same length, time for the reference voltage VREF to be transmitted from each switch 310A-1 to 310A-m, etc. of the plurality of switching regions 310A to 310D to each subpixel on the display panel 100 for each conductive line 370A-1 to 370A-m, etc., that is, the settling time, is the same, so that no deterioration problem occurs.

In addition, since the length of each of the plurality of conductive lines 370A-1 to 370A-m, etc. is minimized, the resistance component $R_{REF}1$ and the capacitance component $C_{REF}1$ of the conductive lines 370A-1 to 370A-m, etc. can each be minimized. Accordingly, delay in the reference voltage VREF through the conductive lines 370A-1 to 370A-m, etc. can be prevented, making it possible to implement high-speed driving.

According to the embodiments, each of a plurality of conductive lines 370A-1 to 370A-m, etc. can have a straight line between a corresponding terminal 360A-1 to 360A-m, etc. and a corresponding switch 310A-1 to 310A-m, etc. along one direction (Y-axis direction). Accordingly, since the plurality of conductive lines 370A-1 to 370A-m, etc. are not disposed in a zigzag or serpentine shape, complexity is reduced and electrical short-circuit problem do not occur. Furthermore an increase in the size of the driving device 200 can be prevented.

Figure 8:
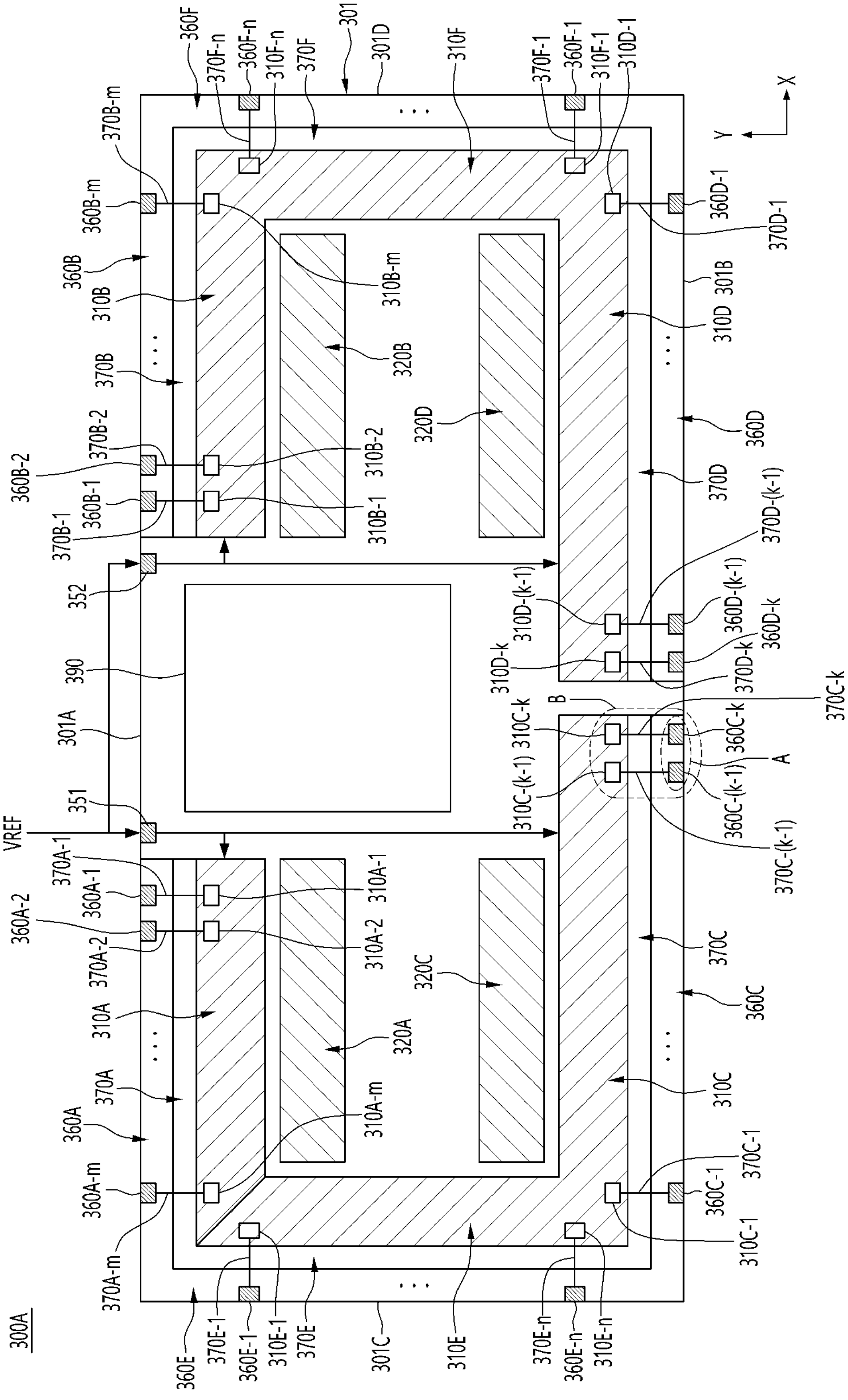
FIG. 8 shows a driving device according to some embodiments.

FIG. 8 shows a driving device according to other embodiments.

The embodiments shown in FIG. 8 are same as the embodiments shown in FIG. 4 except for a fifth and/or sixth pad region 360E and/or 360F, a fifth and/or sixth conductive region 370E and/or 370F and a fourth and/or sixth switching region 310E and/or 310F. Accordingly, in the embodiments shown in FIG. 8, components having the same shape, structure, and/or function as those of the embodiments shown in FIG. 4 are given the same reference numerals and detailed descriptions are omitted. The components missing in the embodiments shown in FIG. 8 can be easily understood from the embodiments shown in FIG. 4.

Referring to FIG. 8, the driving device 300A can comprise a plurality of pad regions 360A to 360F, a plurality of switching regions 310A to 310F, a plurality of conductive regions 370A to 370F, etc.

The plurality of pad regions 360A to 360F can comprise a first group of pad regions 360A and 360B and a second group of pad regions 360C and 360D as well as a fifth pad region 360E. The fifth pad region 360E can be disposed adjacent to a third side portion 301C of the substrate 301. The plurality of pad regions 360A to 360F can comprise a sixth pad region 360F disposed adjacent to a fourth side portion 301D of the substrate 301.

The plurality of switching regions 310A to 310F can comprise a first group of switching regions 310A and 310B and a second group of switching regions 310C and 310D as well as a fifth switching region 310E. The fifth switching region 310E can be disposed farther from the third side portion 301C of the substrate 301 than the fifth pad region 360E. The plurality of switching regions 310A to 310F can comprise a sixth switching region 310F disposed farther from the fourth side portion 301D of the substrate 301 than the sixth pad region 360F.

The plurality of conductive regions 370A to 370F can comprise a first group of conductive regions 370A and 370B and a second group of conductive regions 370C and 370D as well as a fifth conductive region 370E. The fifth conductive region 370E can be disposed between the fifth pad region 360E and the fifth switching region 310E. The plurality of conductive regions 370A to 370F can comprise a sixth conductive region 370F disposed between the sixth pad region 360F and the sixth switching region 310F.

Meanwhile, conductive lines 370E-1 to 370E-n included in the fifth conductive region 370E can be respectively connected between terminals 360E-1 to 360E-n included in the fifth pad region 360E and switches 310E-1 to 310E-n included in the fifth switching region 310E. The conductive lines 370E-1 to 370E-n can have a straight line along one direction (X-axis direction) between the terminals 360E-1 to 360E-n and the switches 310E-1 to 310E-n. Since a plurality of driving regions 320A to 320D are not disposed between the fifth pad region 360E and the fifth switching region 310E, the length of each of the conductive lines 370E-1 to 370E-n can be minimized and can also be the same. Accordingly, a delay in the reference voltage VREF can be prevented, enabling high-speed driving, and the settling time for each subpixel (or pixel) on the display panel 100 can be the same, thereby preventing deterioration.

Likewise, conductive lines 370F-1 to 370F-n included in the sixth conductive region 370F can be respectively connected between terminals 360F-1 to 360F-n included in the sixth pad region 360F and switches 310F-1 to 310F-n included in the sixth switching region 310F. The conductive lines 370F-1 to 370F-n can have a straight line along one direction (X-axis direction) between the terminals 360F-1 to 360F-n and the switches 310F-1 to 310F-n.

Since the plurality of driving regions 320A to 320D are not disposed between the sixth pad region 360F and the sixth switching region 310F, the length of each of the conductive lines 370F-1 to 370F-n can be minimized and can be also the same. Accordingly, a delay in the reference voltage VREF can be prevented, enabling high-speed driving, and the settling time for each subpixel (or pixel) on the display panel 100 can be the same, thereby preventing deterioration.

Even though FIG. 8 shows that the third pad region 360C and the fourth pad region 360D, the third conductive region 370C and the fourth conductive region 370D, and the third switching region 310C and the fourth switching region 310D are being separated from each other, but, in some embodiments, they can be integrally formed (or connected) without being separated from each other.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

What is claimed is:

1. A driving device comprising:

a plurality of pad regions disposed along a plurality of side portions of a substrate and each of the plurality of pad regions comprising a plurality of terminals;

a plurality of switching regions disposed farther from the plurality of side portions than the plurality of pad regions and each of the plurality of switching regions comprising a plurality of switches; and a plurality of driving regions disposed adjacent to a central region of the substrate, wherein each of the plurality of switching regions is located between a corresponding pad region of the plurality of pad regions and a corresponding driving region of the plurality of driving regions, and wherein each switch of the plurality of switches is connected to each terminal of the plurality of terminals to provide a connection between a single switch and a single terminal.

2. The driving device of claim 1, wherein the plurality of side portions comprises:

a first side portion and a second side portion, wherein the first and second side portions face each other in a first direction; and a third side portion and a fourth side portion, wherein the third and fourth side portions face each other in a second direction.

3. The driving device of claim 2, comprising:

a plurality of conductive regions each comprising a plurality of conductive lines, each of the plurality of conductive lines connected between a corresponding terminal of the plurality of terminals and a corresponding switch of the plurality of switches and each of the plurality of conductive regions disposed between a corresponding pad region of the plurality of pad regions and a corresponding switching region of the plurality of switching regions, wherein the plurality of pad regions comprise a first group of pad regions disposed adjacent to the first side portion, the plurality of switching regions comprises a first group of switching regions disposed farther from the first side portion than the first group of pad regions, and the plurality of conductive regions comprises a first group of conductive regions disposed between the first group of pad regions and the first group of switching regions.

4. The driving device of claim 3, wherein the plurality of pad regions comprises a second group of pad regions disposed adjacent to the second side portion, the plurality of switching regions comprises a second group of switching regions disposed farther from the second side portion than the second group of pad regions, and the plurality of conductive regions comprises a second group of conductive regions disposed between the second group of pad regions and the second group of switching regions.

5. The driving device of claim 4, wherein the first group of switching regions comprises:

a first switching region; and a second switching region spaced apart from the first switching region, the second group of switching regions comprises:

a third switching region; and a fourth switching region spaced apart from the third switching region.

6. The driving device of claim 5, wherein a length of the third switching region is greater than a length of the first switching region, and a number of switches included in the third switching region is greater than a number of switches included in the first switching region.

7. The driving device of claim 5, wherein a length of the fourth switching region is greater than a length of the second switching region, and a number of switches included in the fourth switching region is greater than a number of switches included in the second switching region.

8. The driving device of claim 4, wherein the plurality of pad regions comprises a fifth pad region disposed adjacent to the third side portion, the plurality of switching regions comprises a fifth switching region disposed farther from the third side portion than the fifth pad region, and the plurality of conductive regions comprises a fifth conductive region disposed between the fifth pad region and the fifth switching region.

9. The driving device of claim 8, wherein the plurality of pad regions comprises a sixth pad region disposed adjacent to the fourth side portion, the plurality of switching regions comprises a sixth switching region disposed farther from the fourth side portion than the sixth pad region, and the plurality of conductive regions comprises a sixth conductive region disposed between the sixth pad region and the sixth switching region.

10. The driving device of claim 3, wherein the each of the plurality of conductive lines has a straight line along one direction between the corresponding terminal and the corresponding switch.

11. The driving device of claim 3, wherein the plurality of conductive lines has the same length.

12. The driving device of claim 1, wherein distances between the plurality of terminals and the plurality of switches are the same.

13. The driving device of claim 1, wherein a reference voltage is configured to be transmitted to the plurality of switches through at least one input terminal and to a display panel through the plurality of terminals.

14. A driving device, comprising:

a first pad region and a second pad region, wherein the first pad region and the second pad region are spaced apart from each other along a first side portion of a substrate;

a third pad region and a fourth pad region, wherein the third pad region and the fourth pad region are spaced apart from each other along a second side portion of the substrate;

a first driving region and a second driving region, wherein the first driving region and the second driving region are disposed on a first side portion of a central area of the substrate and correspond to the first pad region and the second pad region, respectively;

a third driving region and a fourth driving region, wherein the third driving region and the fourth driving region are disposed on a second side portion of the central area of the substrate and correspond to the third pad region and the fourth pad region, respectively;

a first switching region between the first pad region and the first driving region;

a second switching region between the second pad region and the second driving region;

a third switching region between the third pad region and the third driving region; and a fourth switching region between the fourth pad region and the fourth driving region, wherein a length of the third switching region is greater than a length of the first switching region, and wherein a number of switches included in the third switching region is greater than a number of switches included in the first switching region.

15. The driving device of claim 14, comprising:

a first conductive region between the first pad region and the first switching region;

a second conductive region between the second pad region and the second switching region;

a third conductive region between the third pad region and the third switching region; and a fourth conductive region between the fourth pad region and the fourth switching region.

16. The driving device of claim 15, wherein each of the first pad region, the second pad region, the third pad region, and the fourth pad region comprises a plurality of terminals, each of the first switching region, the second switching region, the third switching region, and the fourth switching region comprises a plurality of switches, and each of the first conductive region, the second conductive region, the third conductive region, and the fourth conductive region comprises a plurality of conductive lines.

17. The driving device of claim 16, wherein each of the plurality of conductive lines has a straight line along one direction between a corresponding terminal and a corresponding switch.

18. The driving device of claim 16, wherein distances between the plurality of terminals and the plurality of switches are the same.

19. A display device comprising:

a display panel comprising a plurality of subpixels; and a driving device configured to drive the display panel, wherein the driving device comprises:

a plurality of pad regions disposed along a plurality of side portions of a substrate and each of the plurality of pad regions comprising a plurality of terminals connected to the plurality of subpixels;

a plurality of switching disposed farther from the plurality of side portions than the plurality of pad regions and each of the plurality of switching regions comprising a plurality of switches; and a plurality of driving regions disposed adjacent to a central region of the substrate, and wherein each of the plurality of switching regions is located between a corresponding pad region of the plurality of pad regions and a corresponding driving region of the plurality of driving regions, and wherein each switch of the plurality of switches is connected to each terminal of the plurality of terminals to provide a connection between a single switch and a single terminal.

20. The display device of claim 19, wherein a reference voltage is configured to be transmitted to the plurality of switches through at least one input terminal and to the display panel through the plurality of terminals.

* * * * *